FINE WIRE MANIPULATOR AND BONDING INSTRUMENT FOR TRANSISTORS

Filed July 5, 1960 7 Sheets-Sheet 1

INVENTOR
Frederick W. Kulicke, Jr.
BY
Bilber & Morgenan
ATTORNEYS.

FINE WIRE MANIPULATOR AND BONDING INSTRUMENT FOR TRANSISTORS

Filed July 5, 1960 7 Sheets-Sheet 2

INVENTOR
Frederick W. Kulicke, Jr.
BY
Siller & Moyerman
ATTORNEYS

FINE WIRE MANIPULATOR AND BONDING INSTRUMENT FOR TRANSISTORS

Filed July 5, 1960 7 Sheets-Sheet 3

INVENTOR
Frederick W. Kulicke, Jr.
BY
ATTORNEYS

FINE WIRE MANIPULATOR AND BONDING INSTRUMENT FOR TRANSISTORS

Filed July 5, 1960 7 Sheets-Sheet 4

INVENTOR
Frederick W. Kulicke, Jr.
BY
Silver & Mayerman
ATTORNEYS

INVENTOR
Frederick W. Kulicke, Jr.
BY
Belker & Moyerman
ATTORNEYS

INVENTOR
Frederick W. Kulicke, Jr.
BY
Bilker & Moyerman
ATTORNEYS

INVENTOR
Frederick W. Kulicke, Jr.
BY
Bilher & Meyerman
ATTORNEYS

United States Patent Office 3,149,510
Patented Sept. 22, 1964

3,149,510

FINE WIRE MANIPULATOR AND BONDING INSTRUMENT FOR TRANSISTORS

Frederick W. Kulicke, Jr., Philadelphia, Pa., assignor to Kulicke & Soffa Mfg. Co., Philadelphia, Pa., a corporation of Pennsylvania Filed July 5, 1960, Ser. No. 40,890
26 Claims. (Cl. 78—82)

This invention relates to a fine wire bonding instrument, and more particularly relates to a thermocompression bonding apparatus for manipulating, positioning and securing extremely small diameter wire intermediate semi-conductor crystal wafers and terminal posts on transistor headers.

During the final phases of assembly of certain transistors, it is necessary to secure extremely fine gauge wire or whiskers to minute stripes evaporated or otherwise deposited upon semi-conductor crystal wafers and thereafter bond the other end of the wire whisker to terminal posts on transistor headers upon which the wafers themselves are bonded. Not only the thickness of the stripes but also the diameter of the wire range from a few tenths of a mil to less than ten mils, and it is essential that the wire-stripe juncture be bonded positively with a very high degree of precision. In addition, the wire interconnecting each post and the corresponding stripe must be stretched taut so as not to alter the characteristics established for the completed transistor unit. Moreover, the bonding conditions demand great delicacy in handling since variations in the electrical value of the ultimate finished transistor will make such a product unreliable, ineffective and frequently worthless.

As would be apparent from the sizes of the crystal wafers, the juncture stripes and the wire whiskers, such operations must be performed under microscopic observation and, at the same time, require extreme sensitivity in manipulation of the various components. Heretofore, the means for assembling such devices has been exceedingly time consuming and inaccurate to the extent of producing a very high rejection rate. Since a considerable amount of labor has already been expended in the fabrication of the semi-conductive wafers themselves, it is important that the sequence of operations in bonding the lead wire to the wafer be reduced to as small a time interval as possible and be performed at a high level of precision consistently.

It is therefore an object of this invention to provide a thermocompression bonding instrument for manipulating, positioning and securing extremely fine lead wire between crystal wafers and terminal posts on transistor headers.

Another object of this invention is to provide a bonding instrument wherein precision manipulation of the lead wire, the bonding tool and the transistor header may be rapidly accomplished without backlash or lost motion.

Another object of this invention is to provide a bonding instrument wherein the exact pressure to be applied by the bonding tool is automatically obtainable for either bonding the wire to the wafer or sealing off the wire end at the terminal posts.

Another object of this invention is to provide a manipulator for a bonding instrument which will enable an operator to translate a large movement within a plane into a proportionally reduced movement in the same direction with extreme delicacy and sensitivity.

Another object of this invention is to provide a mechanical manipulator for a wire bonding instrument enabling relatively unskilled operators to position a component with accuracies in the order of small fractions of a tenth of a mil easily and rapidly.

Another object of this invention is to provide a bonding instrument for applying the exact temperature and pressure to semi-conductor crystal wafers so that lead wires may be secured thereto rapidly and uniformly without overheating, oxidizing or causing damage which might interfere with the characteristics and working of the completed transistor.

Other objects of this invention are to provide an improved device of the character described which is easily and economically produced, that is sturdy in construction, and which is highly efficient in operation.

With the above and other objects in view, this invention consists in the details of construction and combination of parts which will be more fully understood from the following detailed description when read in conjunction with the accompanying drawing in which.

Figure 1:
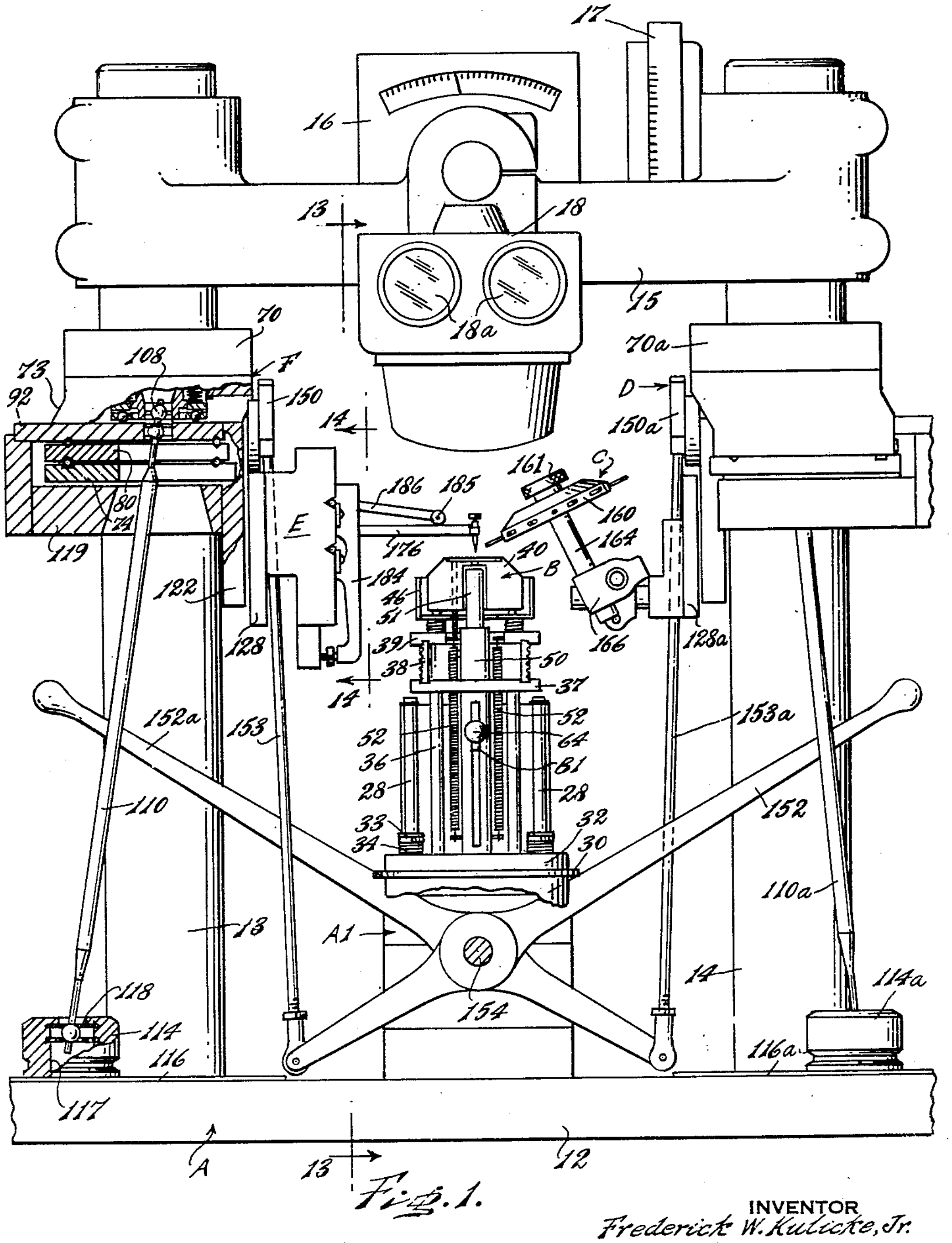
FIG. 1 is a front elevational view, and partly in section, of a fine wire bonding instrument embodying this invention.

Referring now in greater detail to the drawings in which similar reference characters refer to similar parts, this invention embodies a fine wire bonding instrument comprising a frame, generally designated as A, a transistor holder and heat column, generally designated as B, rotatable in the frame about a vertical axis, a fine wire dispenser, generally designated as C, a manipulator D supporting the dispenser and positioning the wire in three planes, a bonding hammer assembly, generally designated as E, and a manipulator F for positioning the bonding hammer assembly in three planes.

Figures 2, 3, 4, 5, 6:
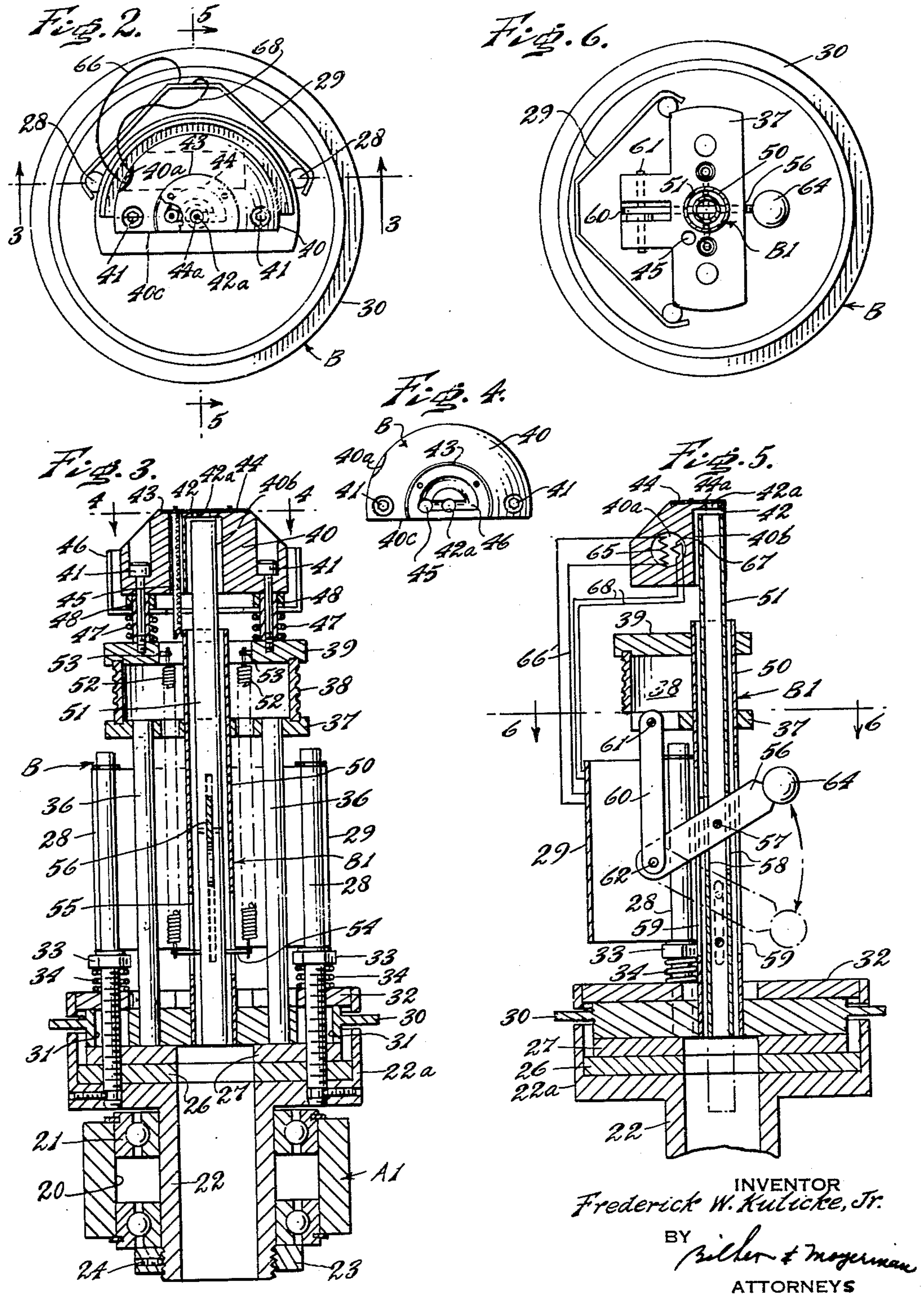
FIG. 2 is a top plan view of a transistor holder and heating column embodied in the bonding instrument.
FIG. 3 is a sectional view taken along lines 3—3 of FIG. 2.
FIG. 4 is a sectional view taken along lines 4—4 of FIG. 3.
FIG. 5 is a sectional view taken along lines 5—5 of FIG. 2.
FIG. 6 is a sectional view taken along lines 6—6 of FIG. 5.

The frame A comprises a base plate 12 having a pair of cylindrical columns 13 and 14 interconnected at their upper portions by a transverse beam 15. The beam 15 serves as a convenient carrying platform for a temperature indicator-controller 16 and a gas flowmeter 17. A stereo microscope 18 is adjustably bracketed to the beam so as to enable an operator sitting before the instrument to look horizontally into oculars 18*a* and observe under magnification the work being performed upon a transistor G supported at the top of holder B. Affixed to the base plate 12 intermediate the columns 13 and 14 is a pedestal A1 having a bowl portion 20 within which is secured an annular ball bearing 21. See FIG. 3.

Referring now to FIGS. 2 to 6, the lower portion of the heating column has a cupped or flanged hub 22 which is rotatably supported within the bearing 21. A lock nut 23 is threaded to the bottom of the hub 22 and adapted to engage against the bearing 21 in order to vary the degree of rotational freedom thereof. The lock nut 23 is secured in position by a set screw 24 when the desired degree of rotational friction of the heat column B is suitably adjusted through the bearing. An annular plate 26 and spacer 27 are mounted within the cup portion 22*a* and threadedly support a pair of vertical rods 28 which hold a terminal panel 29. An input positioning slider 30 having enlarged apertures 31 therein through which the rods 28 freely extend is slidably supported within the cup 22*a* upon spacer plate 27. A pressure plate 32 bears downwardly upon the slider 30 sandwiching it against the plate 27 as a result of thumb nuts 33 and springs 34 mounted on the rods 28. The desired degree of horizontal X- and Y-freedom of movement is varied by turning the thumb nuts 33 to change the compression of the springs 34 against the pressure plate 32. A pair of vertical posts 36 are vertically affixed to to the input slider 30 and support a lower deck member 37 at their upper ends. Spaced above the deck 37 and secured thereto by a heat dissipator 38 is an upper deck member 39. The heat dissipator is a semi-cylindrical wall having a plurality of serrations and fins which enable heat to readily radiate into the atmosphere. A platen 40 containing a heating element and a thermocouple 65 and 67 therein is secured to the deck 39 by screws 41. The platen 40 is a plated brass block for readily conducting heat and is D-shaped in horizontal cross-section with a core 40*a* in which the heating element and thermocouple are inserted. An arcuate channel 40*b* extends vertically in the flat front face 40*c* of the platen and terminates in a shoulder 42. The shoulder 42 has a circular opening 42A which extends therethrough for communication with the channel 40*b*. The transistor G is inserted into the opening 42*a* from the channel 40*b* below and is detachably held in abutment with the shoulder 42 by a resilient bolt assembly B1 as will be more fully described hereinafter. A thin flat bonnet 44 is pinned to the upper surface of the platen 40 within an arcuate lip 43, the bonnet having an aperture 44*a* registering with the shoulder opening 42*a*. Vertically extending through the platen 40 below the bonnet 44 is a gas supply tube 45 which interconnects with grooved passageways 46 in the upper platen surface and directs a flow of forming gas (hydrogen and nitrogen) about the apertures 42*a*, 44*a* against the transistor header G during bonding. The forming gas flows from under the bonnet 44 to blanket the transistor with a reducing atmosphere thereby precluding oxidation of any of the transistor components when the bonding temperatures (580° F.) are imposed. A heat shielding cup 46 is mounted in spaced relationship about the lower portion of the platen 40 and is resiliently urged upwardly by coil springs 47 against spacer collars 48. The shield 46 reflects the heat radiated outwardly from the platen 40 and redirects the radiation back toward the platen to concentrate the high temperature at the transistor G.

The bolt assembly B1 comprises a stationary tubular column 50 vertically affixed to the slider 30 and supported at its upper portion by the deck 37. Telescopically slidable in the tube 50 is a header supporting tube 51 which is resiliently urged upwardly by coil springs 52. The springs 52 are mounted in tension between hangars 53 inwardly extending from the deck 39 and pin 54 radially projecting from the lower portion of the tube 51 through longitudinal slots 55 in the stationary tube 50. A depressor 56 is hinged upon a pin 57 diametrically affixed within the slidable tube 51 and extends through opposed slots 58 in the tube 51 side wall and opposed slots 59 in the stationary tube 50 side wall. A bracket 60 hinged to the deck 37 at 61 downwardly depends therefrom and is pivotally coupled to the rear end of the depressor 56. Thus, the slider tube 51 will ordinarily be resiliently urged upwardly through the channel 40*b* toward the shoulder 42 in the platen 40 and retain a transistor G projecting through the opening 42*a* against the shoulder. Pressing downwardly on knob 64 of the depressor 56 by hand will lower the slider tube 51 against the opposing spring tension and enable successive transistor headers G to be mounted in the platen 40 preparatory to having the bonding operations performed thereon. Suitable lead-in wires 66 and 68 extend from the terminal panel 29 and interconnect the heating element 65 and the thermocouple 67 with the indicator-controller 16. The bottom of the tube 45 is coupled to the flowmeter 17 by flexible tubing, and the flowmeter through piping and a series of valves is connected to a source of forming gas under pressure.

Figure 13:
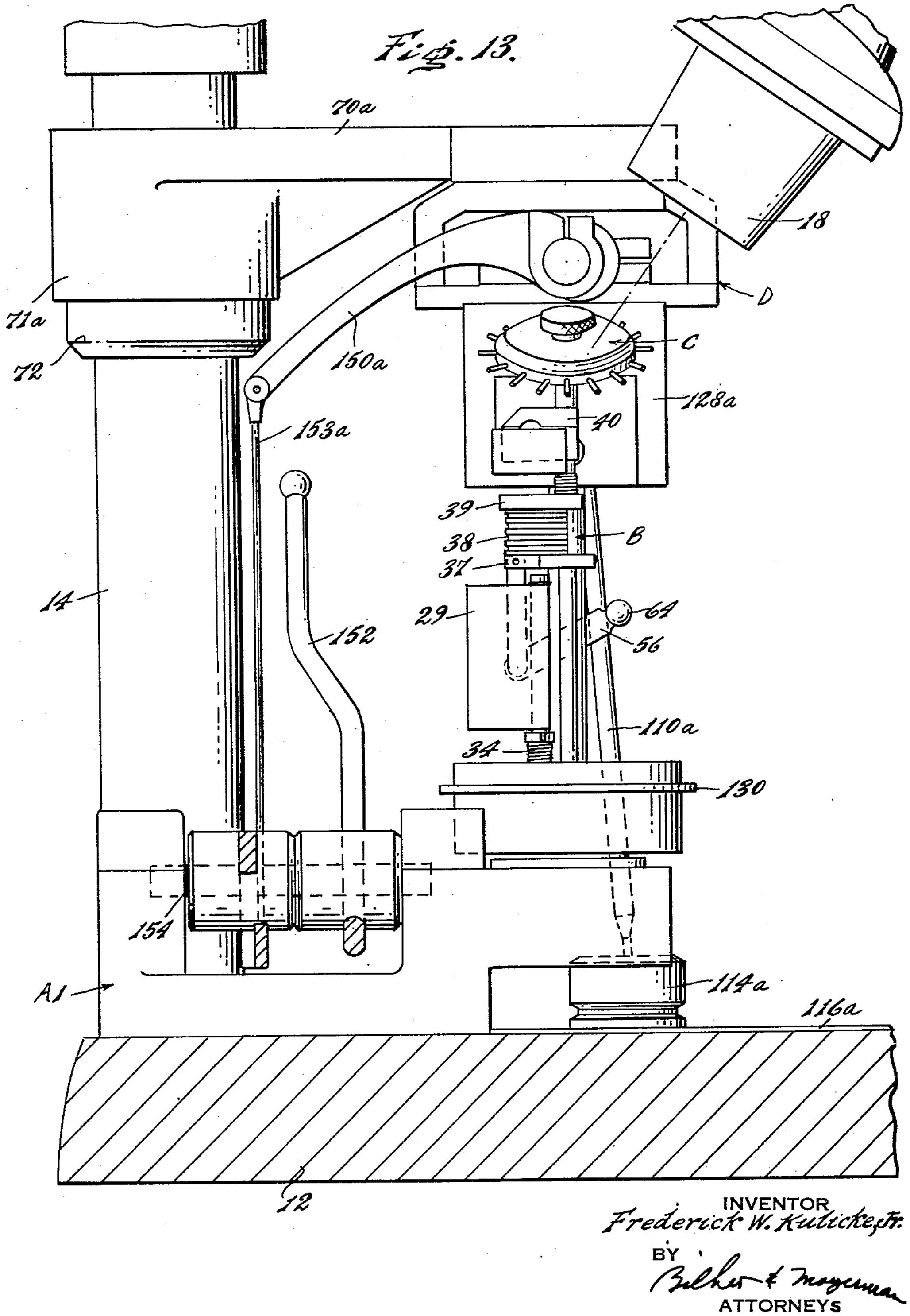
FIG. 13 is a sectional view taken along lines 13—13 of FIG. 1.
Figures 14, 15, 16:
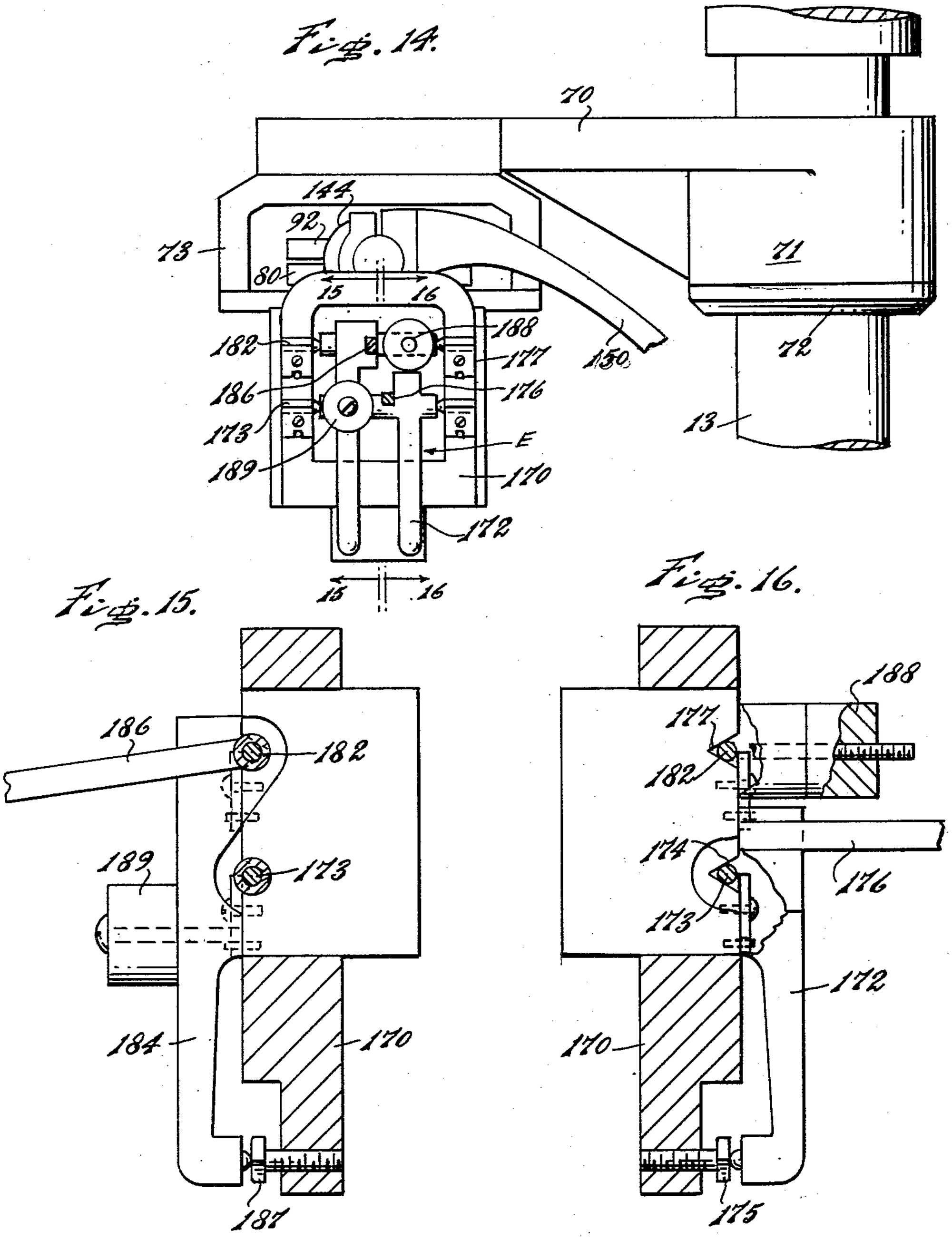
FIG. 14 is a sectional view taken along lines 14—14 of FIG. 1.
FIG. 15 is a sectional view taken along lines 15—15 of FIG. 14.
FIG. 16 is a sectional view taken along lines 16—16 of FIG. 14.

The manipulator D and the manipulator F are in all respects identical and differ only in the sense that the wire dispenser C is mounted upon the former whereas the bonding hammer assembly E is secured to the latter. As shown in FIG. 13, the manipulator D is mounted to column 14 by a support arm 70*a* having a split yoke 71*a* clamped about the column. An aluminum collar 72 is also detachably clamped to the column 14 below the yoke 71*a* and seats the support arm vertically to permit swinging thereof in a horizontal arc as desired. Similarly, the manipulator F is clamped to column 13 through support arm 70 with split yoke 71 embracing the column and seated upon aluminum collar 72 as shown in FIG. 14. For purposes of brevity, the description will now be confined to the manipulator F as illustrated in FIGS. 7 to 12 inclusive, it being understood that the details of construction apply equally to the manipulator D, the reference numerals of the manipulator D having appended thereto in the drawings the alphabetical reference character "*a*" to differentiate the identical constructional components thereof from those of the manipulator F.

Figures 7, 8, 10, 19:
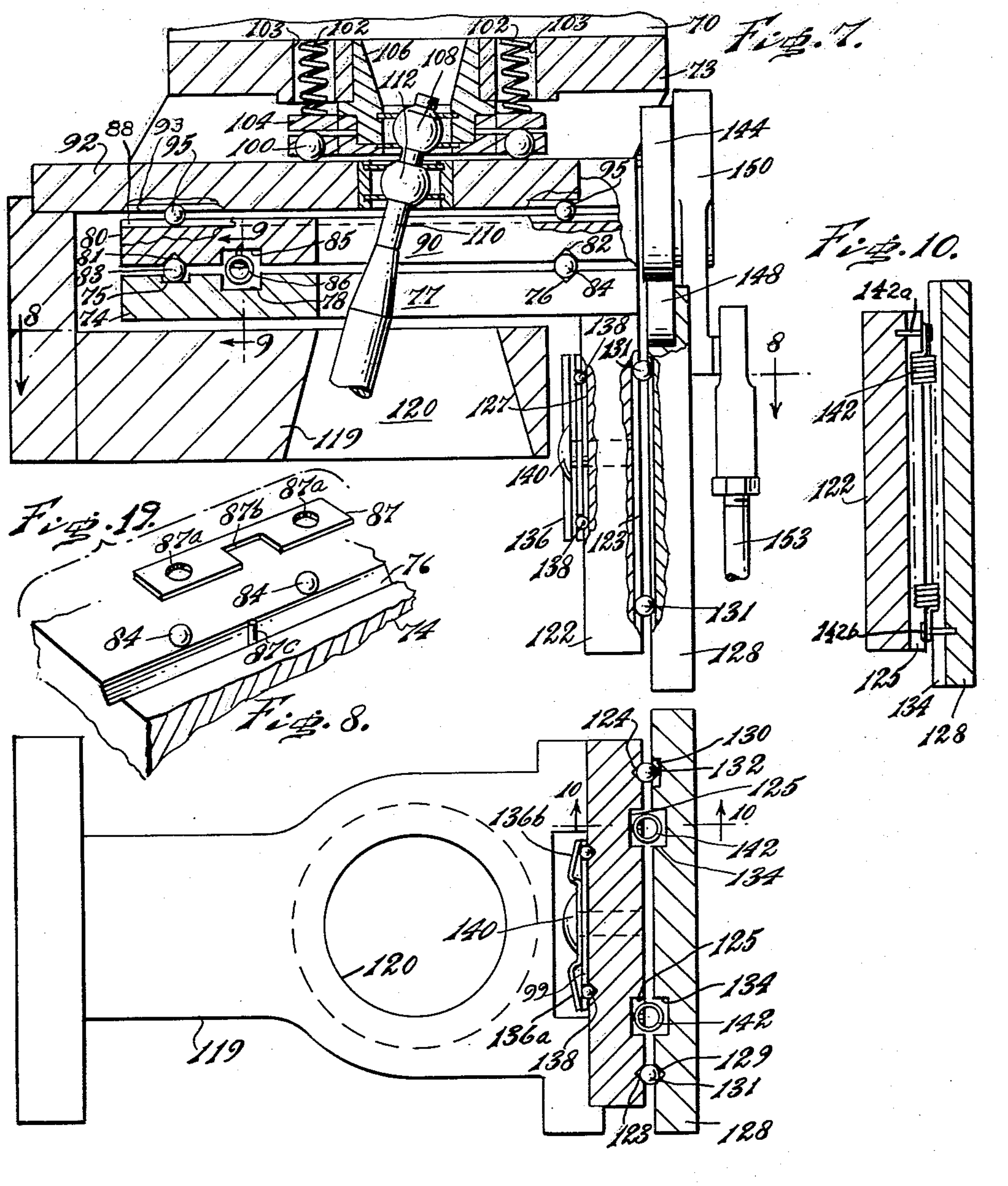
FIG. 7 is an enlarged fragmentary front elevational view, and partly in section of the upper portion of the manipulator embodied in this invention.
FIG. 8 is a sectional view taken along lines 8—8 of FIG. 7.
FIG. 10 is a sectional view taken along lines 10—10 of FIG. 8.
FIG. 19 is a fragmentary exploded view of a ball separator embodied in the manipulator of this invention.
Figures 11, 20:
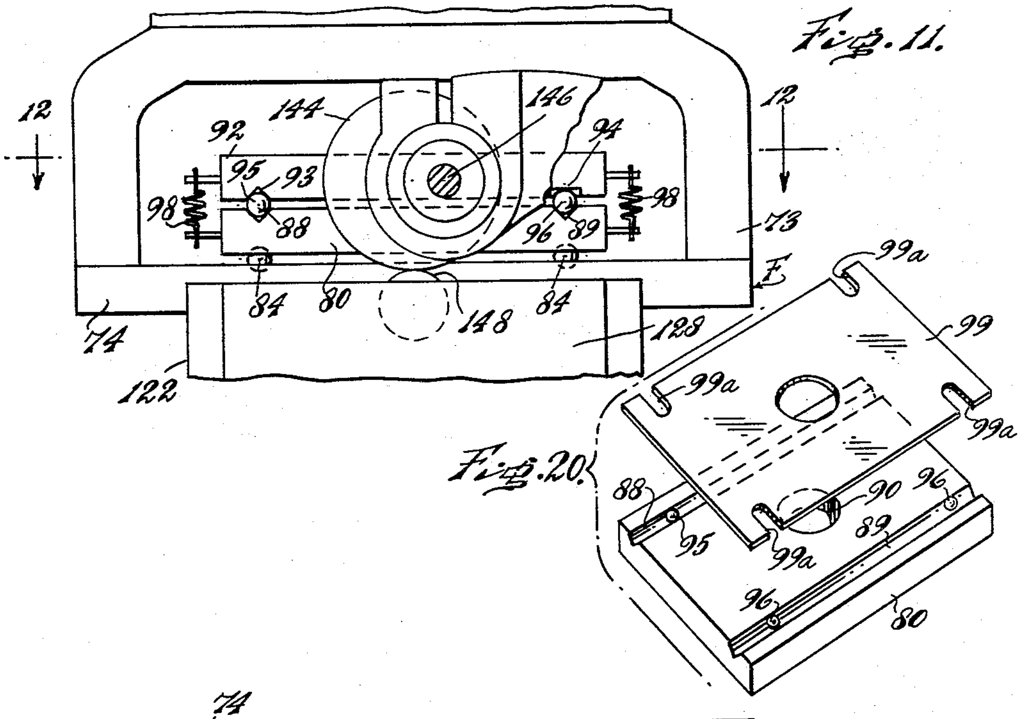
FIG. 11 is a side elevational view, and partly broken away, of the manipulator shown in FIG. 7.
FIG. 20 is a perspective view of another ball separator embodied in this invention.
Figure 12:
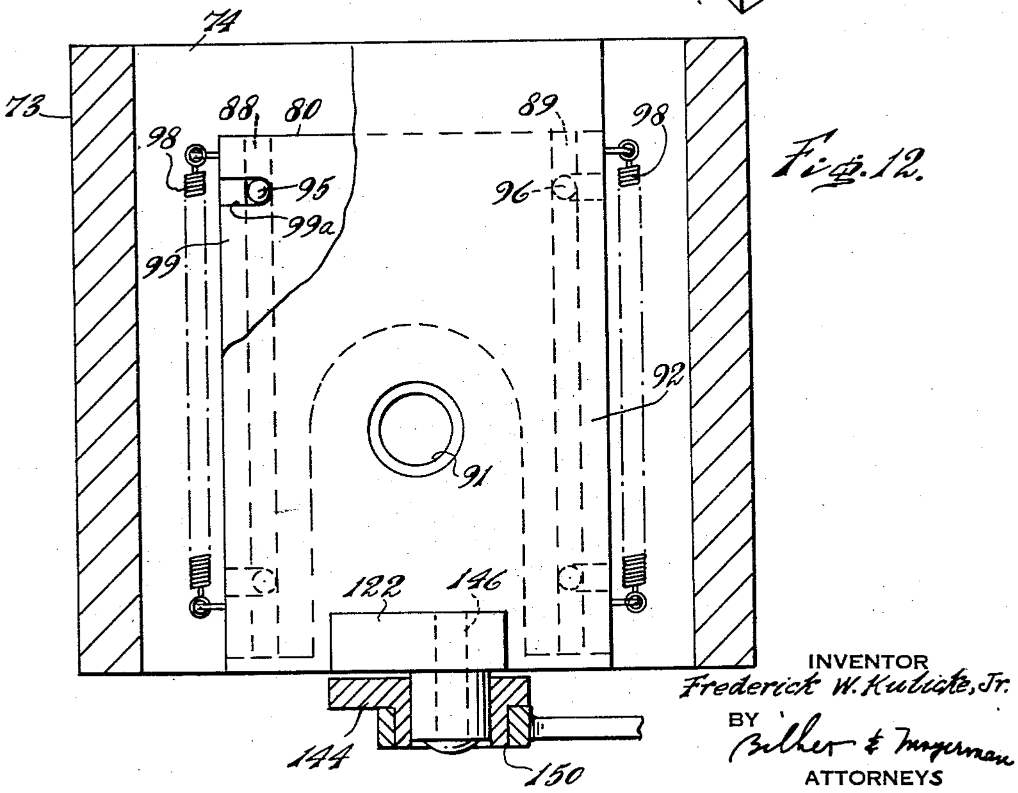
FIG. 12 is a sectional view taken along lines 12—12 of FIG. 11.

Referring particular to FIGS. 7 and 11, an inverted U-shaped bracket 73 is bolted to the under forward end of the support arm 70. Secured to the downwardly depending legs of the bracket 73 is a guideway plate 74 having a pair of spaced parallel raceways or tracks 75 and 76 longitudinally extending in the upper surface thereof. The fixed guideway 74 also has a central aperture 77 and a pair of longitudinally extending spring retaining slots 78 inboard of the tracks 75 and 76.

Figure 9:
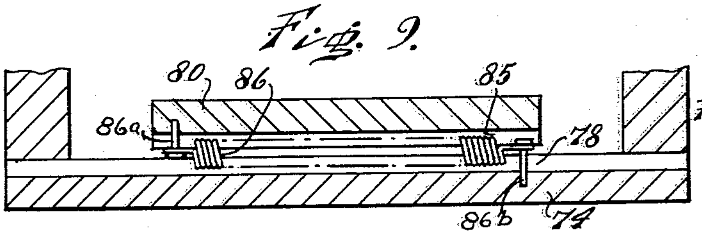
FIG. 9 is a sectional view taken along lines 9—9 of FIG. 7.

A first stage or X-axis slider 80 glides upon the guideway 74 perpendicular to the plane of the paper as shown in FIG. 7 and has a pair of longitudinally extending raceway tracks 81 and 82 in the bottom surface thereof complementary with the respective tracks 75 and 76 in the guideway 74. A pair of ball bearings 83 are retained within raceways 75 and 81, and a second pair of ball bearings 84 are retained intermediate the raceways 76 and 82. The balls of each pair are longitudinally spaced in their respective raceways by ball separators 87 as shown in FIG. 19. The ball separators 87 comprise elongated strips of brass having longitudinally spaced apertures 87*a* each of which freely encircles a ball bearing. A medial notch 87*b* in the separator 87 engages a pin 87*c* upwardly extending from track 76 to restrict longitudinal movement of the separator, lateral movement of the separator being limited by the balls themselves. Spaced longitudinally extending slots 85 in the under surface of the slider 80 are complementary with the slots 78 in the fixed guideway 74. Coil springs 86 tensioned within the passageways defined by the complementary slots 78 and 85 are hung upon pins 86a downwardly projecting from the left hand end of slots 85 and pins 86b upwardly projecting from the right hand end of 78 as shown in FIG. 9 to preload and draw the slider from left to right as illustrated in FIG. 9. The upper surface of the X-axis slider 80 has a pair longitudinally extending trackways 88 and 89 which are oriented at right angles to the trackways 81 and 82 as shown in FIGS. 7 and 11, and an opening 90 vertically extends entirely through the thickness of the slider 80.

A Y-axis or second stage slider plate 92 having raceways 93 and 94 in the lower surface thereof complementary with the respective raceways 88 and 89 in the X-axis slider 80 is slidably supported thereon on ball bearing pairs 95 and 96 positioned within the corresponding raceways. Ball separators 99 retain the balls of each pair longitudinally spaced from each other. Springs 98 hung at the outboard edges of the X-axis slider 80 at its forward portion and the Y-axis slider 92 at its rearward portion pre-loads the Y-axis slider into the plane of the paper as shown in FIG. 11. See also FIG. 12.

Referring to FIG. 7, an annular thrust bearing 100 is slidably positioned on the upper surface of the second stage slider 92. Circumferentially spaced springs 102 pocketed within blind holes in the bight of the bracket 73 compressedly bear down upon annular ring member 104 seated upon the thrust bearing 100 to pre-load the X- and Y-sliders in a direction perpendicular to their slidability.

Centrally disposed within an opening in the bight portion of the bracket 73 is a bushing 106 in which is snapped a heim or swivel bearing 108. The heim swivel bearing 108 is an oblated ball with a bore axially extending therethrough, the ball being encapsulated within a complementary race and peripherally rotatable therein. A second swivel heim bearing 112 is mounted within aperture 91 of the second stage slider 92. A rod 110 is secured at the upper end thereof to the swivel bearing 108 affixed within the ball bore of the latter bearing. The rod 110 is slidably coupled within the bore of swivel bearing 112 and projects downwardly through apertures 90 and 77 toward the base 12.

Referring now to the manipulator F in FIG. 1, a circular shoe or chessman 114 is slidably supported on a plastic sheet or pad 116 resting upon the upper surface of the base 12. The pad 116 may be made of a suitable plastic composition such as a phenolic resin. The shoe 114 has a vertically extending central bore 117 in which is snapped a third swivel or heim bearing 118. The lower end of the "joystick" rod 110 slidably extends through the ball bearing of the heim joint 118 in a manner substantially similar to the swivel bearing 112 and projects freely into the bore 117. The friction between the sole of the shoe 114 and the pad 116, i.e. the weight of the shoe times the coefficient of sliding friction, counteracts the forces of the springs 86 and 98 which preload the X-slider 80 and the Y-slider 92 respectively in a predetermined direction. Thus, the operator by resting the heel of his hand on the base 12 and with his fingers moving the chessman shoe 114 about the surface of the pad 116 will "feel" the forces of the slider springs thereby being accordingly afforded great sensitivity during manipulation. Similarly, the manipulator D employs a chessman 114a which is universally swiveled to joystick rod 110a and slidably supported on pad 116a. It is to be observed that the constrained ball raceways or tracks in the X-direction and the Y-direction translates the movement of the rod 110 directly into X- and Y-axes respectively with no degree of freedom rotationally. The preferential direction preloading springs 86 and 98 keep backlash and lost motion out of the swivel joint 108 so that movement of the shoe 114 is transmitted directly into a proportionally reduced movement in the same direction at the slider 92.

Referring to FIGS. 7 and 8, a yoke 119 is secured to the left hand edge of the second stage slider 92 and depends therefrom spaced below the bottom of the guideway plate 74 oriented at right angles to the inverted U-shaped bracket 73. The center portion of the yoke 119 has a circular aperture 120 downwardly flaring therethrough which freely encircles the rod 110. Affixed to the right hand vertical surface of the yoke 119, is a Z-axis slideway plate 122 which extends in a vertical plane and is secured to the right hand edge of the slider 92. The right hand or distal surface of the slideway plate 122 has a pair of spaced vertically extending raceways 123 and 124 longitudinally grooved therein. A pair of longitudinally extending spring retaining slots 125 are spaced inboard of the raceways 123 and 124, and a circular aperture 126 extends through the thickness of the slideway 122. The interior surface of the slideway 122 has a pair of spaced raceways 127 parallel to the raceways 123 and 124. A Z-axis slider 128 having a pair of raceways 129 and 130 complementary with the raceways 123 and 124 is slidably supported vertically on the slideway 122. Pairs of balls 131 and 132 respectively ride within each opposed complementary raceways 123, 129 and 124, 130, the balls of each pair being spaced from each other by suitable ball separators. A pair of spring retaining slots 134 are longitudinally grooved in the Z-axis slider 128 complementary with the slots 125 in the vertical slideway 122. A leaf spring 136 having resilient wings 136a and 136b complementary with the raceways 127 retains ball pairs 138 therein, again suitable ball separators such as disclosed in my prior co-pending application, Serial No. 21,706, being utilized to space the balls in each pair apart. The spring 136 is urged against the balls 138 by a stud 140 whose head abuts the surface of the spring and whose neck passes through an opening therein, through the aperture 126 in the slideway 122 and threadedly engages a tapped hole in the slider 128. Thus, the Z-axis slider 128 together with the leaf spring 136 are vertically slidable on balls gliding in the fixed slideway 122, the limitation on vertical movement being restricted by the stud 140 abutting the walls of the aperture 126. Tensioned springs 142 retained within the complementary slots 125 and 134 and hung upon pins therein, as shown in FIG. 10, upon the upper portion of the slideway 122, and the lower portion of slider 128 resiliently urge the slider upwardly against actuating cam 144. The eccentric or cam 144 is affixed to a shaft 146 rotatably journaled in the slideway 122 and abuts a cam follower 148 rotatably supported at the upper edge of the Z-axis slider 128. See FIGS. 7 and 11. A crank arm 150 affixed to the outer end of the shaft 146 is coupled to Z-axis actuating arm 152 through tie rod 153. The Z-axis actuating arm 152 is pivotally supported upon a stationary shaft 154 affixed within the pedestal A1 as shown in FIGS. 1 and 13. Depression of the free end of arm 152 causes pivoting of the crank 150 and rotation of the cam 144. The throw of the cam 144 against cam follower 148 correspondingly depresses the Z-axis slider 128 of the manipulator F in opposition to the tension of the preloading springs 142.

In an identical manner, an actuating arm 152a also pivoted on stationary shaft 154 is coupled through tie rod 153a to crank 150a, rotation of the crank 150a causing eccentric cam 144a to rotate against and depress Z-axis slider 128a on the manipulator D. Manipulation or positioning of shoe 114a about pad 116a in the manipulator D will likewise alter the pivot angle of rod 110a and correspondingly orient the slider 128a in a horizontal plane in X- and Y-directions.

The wire holder C comprises a wheel 160 having a knurled knob 161 for rotatable manipulation by an operator's fingers. A plurality of circumferentially spaced wire holding tubes 162 radially extend from the wheel 160, the wheel being internally indexed with a radially serrated disk (not shown) so that the holder C may be rotatably "clicked" in angular increments corresponding to the circumferential spacing of the retaining tubes 162. A stationary spindle 164 affixed to the serrated disc is adjustably held within a split clamp bracket 166 secured to the face of the Z-axis slider 128a, the bracket 166 permitting positioning adjustment of the dispenser C as desired. Each of the tubes 162 holds a length of fine wire 168 having a jacket 168a of nickel or silver to facilitate handling. The dispensing holder C described above is commonly referred to as a Wollaston wire disk. However, any fine wire dispensing device may be utilized, for example, a continuous wire feeder such as is described in my prior Patent No. 3,018,975, granted January 30, 1962.

Figure 17:
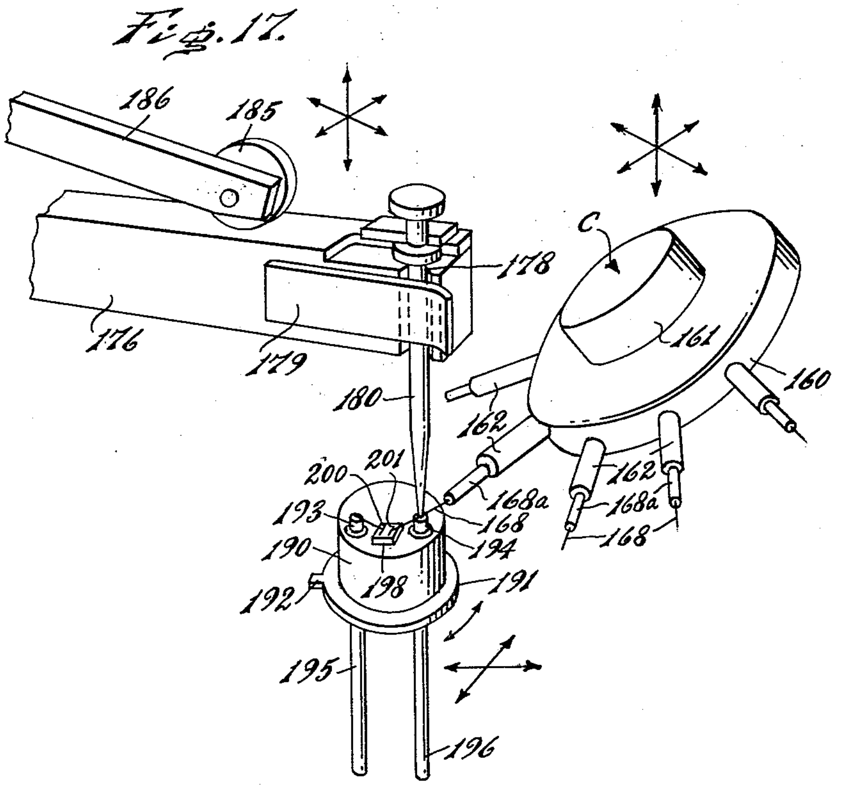
FIG. 17 is a fragmentary perspective view of a bonding tool embodied in this invention and showing the manner of securing lead wires to a transistor header.
Figure 18:
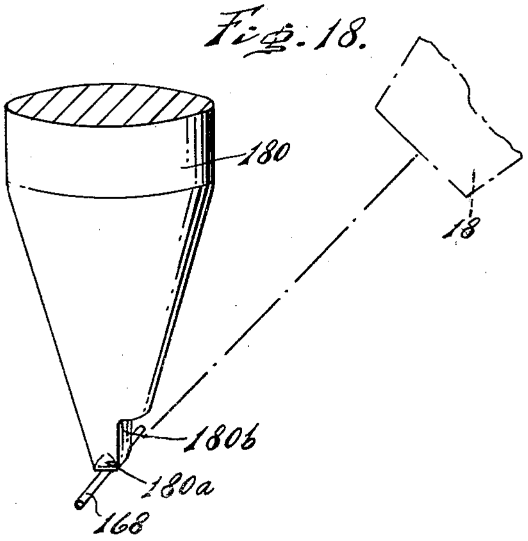
FIG. 18 is an enlarged fragmentary view of a bonding needle embodied in this invention.

The bonding hammer assembly E is secured to the face of the Z-axis slider 128 of the manipulator F by a bracket 170. A leg 172 having a trunnion 173 is pivotally secured to bracket 170 within pivot bearings or V-slots 174 therein. See FIGS. 14, 15 and 16. The lower portion of the leg 172 abuts against an adjustable thumb screw stop 175 threaded within the bracket 170. Extending from the leg 172 is a tool arm 176 which ordinarily projects in a horizontal line when the leg is gravitationally urged by lever action against the stop 175. A bonding needle 180 is vertically mounted at the free end of the arm 176 within V-groove 178 and clamped therein by a flat spring 179 as shown in FIG. 17. The needle 180 may have a steel or sapphire point which is conical with a cone angle approximating 30°. The point of the cone has a radius 180a so that a line contact edge will be defined for the lead wire 168. See FIG. 18. A notch 180b relieves the point to facilitate visibility through the microscope 18, thereby making observation of the wire 168 possible as it is contacted by the needle 180. Urging the needle 180 downwardly against a surface by hand actuation of the Z-axis arm 152 will cause the arm 176 and its leg 172 to pivot with trunnion 174 and raise the leg 172 from stop 175. The pivotal loading force of the tool arm 176 with its leg 172 and needle 180 is relatively light and being in the range of 4 to 10 grams.

Pivoted above the trunnion 173 in V-grooves 177 is a trunnion 182 having leg 184 affixed thereto and downwardly depending therefrom. A heavy loading or hammer arm 186 is mounted within the leg 184 and has a roller 185 at the end thereof. The roller 185 is adapted to abut against the upper edge of the bonding arm 176 after the latter has pivoted upwardly through a predetermined angle. An adjustable thumb screw stop 187 abutting the bottom of the leg 184 elevates or spaces the hammer roller 185 above the bonding arm 176. The load applied by the upper hammer arm 186 including weights 188 and 189 is approximately 80 grams, this load also being exerted upon the bonding needle 180 when the clearance between the roller 185 and the bonding arm 176 closes out. Thus, a double-acting force may be exerted during bonding; the first or lighter force being applied when the needle 180 just touches a surface prior to rotation of the arm 176 through an angle sufficient to engage the roller 185, and the second or heavy load being applied when the bonding arm 176 rotates sufficiently to pivot against the hammer arm 186 and raise leg 184 from its stop 187. It is to be observed that a scrubbing action occurs when the bonding needle 180 is elevated pivotally so as to actuate the heavy force hammer arm load since the surface against which the needle abuts remains stationary.

Referring to FIG. 17, the transistor G comprises a cylindrical header shell 190 having a lower peripheral flange 191 integral therewith from which an indexing tab 192 projects. A pair of terminal posts 193 and 194 upwardly extend from the top of the shell 190 and interconnect respectively with end leads 195 and 196. A semiconductor crystal wafer 198 is bonded to the surface of the header 190 and has a pair of spaced stripes 200 and 201 of gold or silver evaporated upon the wafer surface. In order to complete the transistor circuitry, it is necessary to interconnect the stripe 200 with the terminal post 193 and the stripe 201 with terminal post 194 by respective fine wire whiskers. The transistor G shown is merely an illustrative example of a unit which the bonding instrument described above can accommodate, it being understood that my bonding instrument is equally efficacious for many other transistor types as well as other wire bonding applications.

As is apparent from the foregoing description, the operation of my fine wire bonding instrument is as follows: The transistor G is inserted within the aperture 42a of the holder platen 40 after depressing the bolt assembly B1. The wafer 198 and the terminal posts 193 and 194 project above the surface of the bonnet 44 while the flange 191 abuts the bottom of shoulder 42. Releasing knob 64 of depressor 56 will enable the tube 51 to be spring urged upwardly and seat the transistor in place. While making observation through microscope 18, the transistor holder B is rotated about a vertical axis and the input slider 30 is horizontally adjusted along X- and Y-axes until the center of the wafer 198 registers with the said rotary axis, i.e., the stripes 200 and 201 being equally spaced about the center of rotation. The manipulator D is moved in a horizontal plane by hand orienting the shoe 114a about the surface of the pad 116a until a wire end 168 projecting from the dispenser C is directly above the stripe 200. Z-axis actuating arm 152a is depressed so that the wire end contacts that stripe. The manipulator F is then moved in a horizontal plane by orienting the shoe 114 about the surface of the pad 116 until the bonding needle 180 of the hammer assembly E is directly over the wire end in contact with the stripe 200. At this stage of the operations, the heater and forming gas controls are actuated to bring the transistor G up to bonding temperature with a flow of the reducing gas enveloping the bonding surfaces. Z-axis actuating arm 152 is depressed sufficiently to bring the needle point 180a into bearing engagement with the wire end, care being taken to avoid pivoting the needle arm 176 into contact with loading arm roller 185. There must be no scrubbing when bonding the wire end to the wafer stripes. This may be assured by previously aligning the needle point horizontally with the pivot center 173 by way of thumb stop 175 during preliminary adjustment of the bonding instrument itself. The bonding force of the needle 180 is released when the bond is completed as seen through the microscope 18.

The wire 168 having one end bonded to the stripe 200 is then pulled taut over the post 193 by positioning the wire holder C through the movement of manipulator D in a horizontal plane. Thereafter, by orienting the manipulator F, the needle 180 is positioned directly over the post 193 where the bond is desired. The needle 180 is again lowered by depressing actuating arm 152 until contact is made with the wire 168 lying across the post. However, in this instance, the arm 152 is fully depressed so that the needle arm 176 will pivot vertically and raise up against the loading arm 186 and cause the latter to upwardly pivot from stop 187. When the clearance space below the roller 185 closes out, a higher force is exerted by the bonding needle. In addition, the pivotal action of the hammer asesmbly E causes the needle to scrub against the wire and score it above the post. The dispenser C is then angularly rotated to tear the wire lead and expose a fresh wire from the next adjacent tube 162 now indexed into place. By rotating the translator holder B through 180°, the stripe 201 and the post 194 are positioned adjacent the newly exposed wire extending from the wheel 160, and the operations are repeated.

Although this invention has been described in considerable detail, such description is intended as being illustrative rather than limiting since the invention may be variously embodied, and the scope of the invention is to be determined as claimed.

What is claimed is:

1. A bonding instrument for securing fine lead wire intermediate a crystal wafer and terminal posts on transistor headers comprising a frame, a transistor holder rotatable about a vertical axis in said frame, slider means for horizontally adjusting said holder along X- and Y-axes simultaneously to register the vertical axis thereof with the center of the wafer, a wire holder for dispensing the lead wire, manipulating means in said frame supporting said wire holder for horizontally positioning the wire above the wafer along X- and Y-axes simultaneously, lever means coupled with said manipulating means to depress said wire holder vertically so that the lead wire will be urged into contact with the wafer, a bonding hammer for applying a predetermined force against the wire in contact with the wafer, a second manipulating means in said frame for horizontally positioning said hammer above the wire in contact with the wafer along X- and Y-axes simultaneously, lever means coupled with said second manipulating means to depress said hammer into abutment with the positioned wire, and heating means in said transistor holder for elevating the temperature of the transistor header whereby the lead wire will be bonded to the wafer thermo-compressively when the hammer force is applied.

2. The invention of claim 1 wherein said bonding hammer comprises a bonding tool arm pivotally supported about a horizontal axis and restrained from descending below a horizontal line, and a bonding needle vertically positioned in said tool arm whereby said hammer will pivot upwardly when said needle is depressed into abutment with the wire in contact with the wafer.

3. The invention of claim 2 wherein a loading arm is pivotally supported above said tool arm and normally spaced thereabove, said loading arm abutting against and pivoting upwardly with said tool arm when the latter is pivoted through a predetermined angle whereby a greater force may be applied for bonding the wire to the terminal posts and seal off the wire end as the movement of the needle scrubs the wire.

4. The invention of claim 1 wherein each of said manipulating means comprises a vertically depending rod swivel mounted at the upper end thereof in said frame.

5. The invention of claim 4 wherein a shoe is slidably supported horizontally upon the lower portion of said frame, and swivel joint means coupling said shoe to the lower end of said rod.

6. In a fine wire bonding instrument, a manipulator comprising a frame, a horizontal guideway affixed to said frame, a first slider longitudinally reciprocable in a horizontal plane on said guideway, a second slider longitudinally reciprocable in a horizontal plane upon said first slider transversely to the direction of reciprocation thereof, a rod vertically extending thruogh respective apertures in said sliders and said guideway, ball joint means coupling the upper end of said rod to said frame, swivel joint means spaced below said ball joint means and coupling said rod to said second slider, and resilient thrust bearing means urging said sliders into surface to surface engagement whereby moving said rod will transmit to said second slider a proportionally reduced movement in the same direction.

7. The invention of claim 6 wherein resilient means couples said sliders and said guideway and biases each of said sliders respectively in a predetermined direction along a path longitudinal with the corresponding reciprocation thereof whereby backlash and lost motion is eliminated from said ball joint means.

8. The invention of claim 7 wherein a shoe is slidably supported horizontally upon the lower portion of said frame, and swivel joint means coupling said shoe to the lower end of said rod whereby the coefficient of slidable friction between said shoe and said frame counterbalances the bias of said resilient means.

9. The invention of claim 7 wherein said resilient means comprises tensioned coil springs.

10. In a fine wire bonding instrument, a manipulator comprising a frame, a plate horizontally slidable in the upper portion of said frame, a rod vertically extending through an aperture in said plate, ball joint means coupling the upper end of said rod to the upper portion of said frame, a shoe slidably supported horizontally upon the lower portion of said frame and coupled to the lower end of said rod, and swivel joint means spaced below said ball joint means and coupling said rod to said plate whereby horizontal movement of said shoe will transmit to said plate a proportionally reduced movement in the same direction.

11. The invention of claim 10 including ball swivel joint means coupling said shoe to the lower end of said rod.

12. In a bonding instrument for securing fine lead wires intermediate a crystal wafer and terminal posts on a transistor header, a heating platen for holding the transistor header, means to rotate said platen about a vertical axis, horizontal slidable means coupling said platen with the rotating means for manually positioning said platen about X- and Y-axes simultaneously to superimpose the center of the wafer with said vertical axis, and resilient means detachably retaining the transistor header within said platen, said resilient means comprising a stationary tube vertically disposed below said platen, a slidable tube telescopically supported within said stationary tube, and springs upwardly urging said slidable tube into abutment with an apertured shoulder on said platen whereby the transistor head will extend through the aperture and be retained in position against the shoulder.

13. The invention of claim 12 wherein said platen has a flat bonnet having an opening therein registering with the apertured shoulder, said bonnet being secured to the upper surface of said platen and spaced immediately adjacent thereto, and conduit means extending through said platen and communicating with the space below said said bonnet whereby a stream of reducing gas may be introduced through said conduit means and thereafter directed about the transistor header to prevent oxidation during bonding.

14. In a bonding instrument for securing fine lead wires intermediate a crystal wafer and terminal posts on a transistor header, a bonding hammer assembly comprising a frame, a slider vertically reciprocable in said frame, a tool arm pivoted at one end about a horizontal axis within said slider and restrained from descending below a horizontal line, and a bonding needle vertically positioned adjacent the other end of said arm whereby the arm will pivot upwardly when said needle is depressed into contact with wire superimposed upon the wafer and exert a controlled bonding pressure thereagainst.

15. The invention of claim 14 wherein a loading arm is pivotally supported in said slider spaced above said tool arm and adapted to engage therewith when said needle is pivoted through a predetermined angle whereby a greater force may be applied for bonding the wire to the terminal posts and seal off the wire end as the pivotal movement of the needle scrubs the wire.

16. In a fine wire bonding instrument, a vertically reciprocable member, a bonding tool hingedly supported on said reciprocable member, means to depress said vertically reciprocable member so that said bonding tool will be urged into abutment with wire to be bonded and pivotally bear against with substantially constant force, and auxiliary loading means on said member engaging said bonding tool when the latter has pivoted through a predetermined angle and thereafter applying an additional load thereon sufficient to indent and weaken the wire preparatory to tear-off.

17. In a fine wire bonding instrument, a vertically reciprocable member, a bonding tool hingedly supported about a horizontal axis on said member and restrained from pivoting below a horizontal line, and means to depress said reciprocable member so that said bonding tool will be urged into contact with and pivotally bear with substantially constant force against wire positioned upon a work piece.

18. The invention of claim 17 including auxiliary loading means coupled with said bonding tool only when the later has pivoted upwardly through a predetermined angle so as to apply an additional load thereon sufficient to indent and weaken the wire preparatory to tear-off.

19. In a fine wire bonding instrument, a holder for a work piece comprising a pedestal rotatable about a vertical axis, work piece supporting means slidably coupled and rotatable with said pedestal, and manual adjusting means integral with the supporting means and extending beyond the periphery of said pedestal for radially orienting the supporting means so that the work piece may be rotated about a particular point therein.

20. The invention of claim 19 wherein said manual adjusting means comprises a spring-loaded plate slidably retained within said pedestal, and means for adjusting the frictional freedom of movement of said plate.

21. In a fine wire bonding instrument, a holder for a work piece comprising a rotatable platen apertured to receive the work piece, retaining means including a pair of telescoping tubes resiliently supporting the work piece detachably in said platen, heater means in said platen for elevating the work piece to wire bonding temperature, and conduit means in said platen for directing a stream of an inert gas about the work piece when the wire is compressively tamped into engagement therewith so as to produce a reducing atmosphere thereabout.

22. A manipulator comprising a frame, a horizontal guideway affixed to said frame, a first slider longitudinally reciprocable in a horizontal plane on said guideway, a second slider laterally reciprocable in a horizontal plane on said first slider, a rod pivoted universally at an upper portion of said frame and downwardly depending therefrom through openings in said sliders and said guideway in spaced relationship therewith, thrust bearing means slidable on said second slider and resiliently coupling said sliders with said guideway, biasing means resiliently urging each of said sliders in a predetermined horizontal direction, and swivel means coupling said rod universally to said second slider whereby movement of said rod will transmit a proportionately reduced movement of said second slider in the same direction without backlash or play.

23. The invention of claim 22 wherein a shoe is slidably supported horizontally on the lower portion of said frame, and swivel joint means coupling said shoe to the lower portion of said rod.

24. The invention of claim 22 wherein a third slider is vertically reciprocable on said second slider, and means urging said third slider in a preferential direction so that a point on said third slider may be tri-axially oriented.

25. A manipulator for translating movement with in a plane into a proportionately reduced movement comprising a frame having a universal swivel joint at an upper portion thereof, a rod depending therefrom, a shoe slidably supported on a horizontal surface at the lower portion of said frame, said shoe having a universal swivel joint therein sladably coupled to the lower portion of said rod, a plate horizontally slidable in said frame at the upper portion thereof and coupled to said rod intermediate the swivel joints, and resilient means biasing said plate in a predetermined horizontal direction whereby the coefficient of slidable friction between said shoe and the horizontal surface counterbalances the bias of said resilient means.

26. In a bonding instrument for securing fine lead wires intermediate a crystal wafer and terminal posts on a transistor header, a heating platen for holding the transistor header comprising a stationary tube vertically disposed below said platen, a slidable tube telescopically supported within said stationary tube, and resilient means urging said slidable tube into abutment with an apertured shoulder on said platen whereby the transistor header will extend through the aperture and be retained in position against the shoulder.

References Cited in the file of this patent

UNITED STATES PATENTS

| | | |
|---|---|---|
| 1,292,438 | Cutter | Jan. 28, 1919 |
| 1,711,896 | McLean | May 7, 1929 |
| 1,738,592 | Leonard | Dec. 10, 1929 |
| 1,861,511 | Russell | June 7, 1932 |
| 2,111,471 | Henkes | Mar. 15, 1938 |
| 2,308,493 | Rentiis | Jan. 19, 1943 |
| 2,680,397 | Singer | June 8, 1954 |
| 2,707,826 | Sowter | May 10, 1955 |
| 2,724,762 | Foris | Nov. 22, 1955 |
| 2,920,510 | Barnes | Jan. 12, 1960 |
| 3,051,026 | Costa | Aug. 28, 1962 |
| 3,052,020 | Jones | Sept. 4, 1962 |

FOREIGN PATENTS

| | | |
|---|---|---|
| 292,868 | France | Nov. 16, 1953 |